United States Patent
Masleid et al.

(10) Patent No.: US 9,406,601 B2
(45) Date of Patent: Aug. 2, 2016

(54) BODY-BIAS VOLTAGE ROUTING STRUCTURES

(71) Applicant: INTELLECTUAL VENTURES HOLDING 81 LLC, Las Vegas, NV (US)

(72) Inventors: Robert P. Masleid, Monte Sereno, CA (US); James B. Burr, Foster City, CA (US); Michael Pelham, Sunnyvale, CA (US)

( * ) Notice: Subject to any disclaimer, the term of this patent is extended or adjusted under 35 U.S.C. 154(b) by 0 days.

(21) Appl. No.: 14/160,200

(22) Filed: Jan. 21, 2014

(65) Prior Publication Data
US 2014/0131833 A1    May 15, 2014

Related U.S. Application Data

(60) Continuation of application No. 12/140,197, filed on Jun. 16, 2008, now Pat. No. 8,633,547, which is a division of application No. 10/816,269, filed on Mar. 31, 2004, now Pat. No. 7,388,260.

(51) Int. Cl.
*H01L 23/52* (2006.01)
*H01L 23/535* (2006.01)
*H01L 27/02* (2006.01)

(52) U.S. Cl.
CPC ............. *H01L 23/52* (2013.01); *H01L 23/535* (2013.01); *H01L 27/0218* (2013.01); *H01L 2924/0002* (2013.01)

(58) Field of Classification Search
CPC .... H01L 23/52; H01L 23/535; H01L 27/0218
See application file for complete search history.

(56) References Cited

U.S. PATENT DOCUMENTS

| | | |
|---|---|---|
| 4,605,980 A | 8/1986 | Hartranft et al. |
| 4,907,058 A | 3/1990 | Sakai |
| 5,160,816 A | 11/1992 | Chlop |
| 5,355,008 A | 10/1994 | Moyer et al. |
| 5,447,876 A | 9/1995 | Moyer et al. |
| 5,552,333 A | 9/1996 | Cheung et al. |
| 5,636,129 A | 6/1997 | Her |
| 5,726,477 A | 3/1998 | Williams et al. |
| 5,781,034 A | 7/1998 | Rees et al. |
| 5,895,940 A | 4/1999 | Kim |
| 5,913,122 A | 6/1999 | Lee et al. |
| 6,048,746 A | 4/2000 | Burr |
| 6,087,892 A | 7/2000 | Burr |
| 6,091,283 A | 7/2000 | Murgula et al. |
| 6,169,310 B1 | 1/2001 | Kalnitsky et al. |
| 6,180,998 B1 | 1/2001 | Crafts |
| 6,194,776 B1 | 2/2001 | Amano et al. |
| 6,218,708 B1 | 4/2001 | Burr |
| 6,218,895 B1 | 4/2001 | De et al. |
| 6,260,179 B1 | 7/2001 | Ohsawa et al. |
| 6,262,447 B1 | 7/2001 | Chi |
| 6,303,444 B1 | 10/2001 | Burr |
| 6,405,358 B1 | 6/2002 | Nuber |
| 6,412,102 B1 | 6/2002 | Andreev et al. |
| 6,489,224 B1 | 12/2002 | Burr |

(Continued)

FOREIGN PATENT DOCUMENTS

EP    0624909    11/1994
JP    10199993    7/1998

*Primary Examiner* — Long Pham

(57) ABSTRACT

Body-bias voltage routing structures. In an embodiment, doped well structures distribute body biasing voltages to a plurality of body biasing wells of an integrated circuit.

20 Claims, 16 Drawing Sheets

(56) References Cited

U.S. PATENT DOCUMENTS

| | | |
|---|---|---|
| 6,498,592 B1 | 12/2002 | Matthies |
| 6,536,028 B1 | 3/2003 | Katsioulas et al. |
| 6,570,810 B2 | 5/2003 | Wong |
| 6,617,656 B2 | 9/2003 | Lee et al. |
| 6,677,643 B2 | 1/2004 | Iwamoto et al. |
| 6,724,044 B2 | 4/2004 | Blanchard |
| 6,772,859 B2 | 8/2004 | D'Antonio et al. |
| 6,777,978 B2 | 8/2004 | Hart et al. |
| 6,813,756 B2 | 11/2004 | Igarashi et al. |
| 6,892,375 B2 | 5/2005 | Kimura |
| 6,936,898 B2 | 8/2005 | Pelham et al. |
| 7,003,748 B1 | 2/2006 | Hsu |
| 7,049,699 B1 | 5/2006 | Masleid et al. |
| 7,098,512 B1 | 8/2006 | Pelham et al. |
| 7,211,478 B1 | 5/2007 | Pelham et al. |
| 7,305,647 B1 | 12/2007 | Pelham |
| 7,370,307 B2 | 5/2008 | Seta |
| 7,376,931 B2 | 5/2008 | Kokubun |
| 7,388,260 B1 * | 6/2008 | Masleid et al. ............... 257/371 |
| 7,467,077 B2 | 12/2008 | Hirai |
| 8,633,547 B2 * | 1/2014 | Masleid et al. ............... 257/371 |
| 2001/0024859 A1 | 9/2001 | Takahashi et al. |
| 2001/0028577 A1 | 10/2001 | Sung et al. |
| 2002/0040985 A1 | 4/2002 | Aldrich |
| 2003/0121017 A1 | 6/2003 | Andreev et al. |
| 2003/0237064 A1 | 12/2003 | White et al. |
| 2004/0019870 A1 | 1/2004 | Ohmori |
| 2004/0085099 A1 | 5/2004 | Ratchkov et al. |
| 2004/0123170 A1 | 6/2004 | Tschanz et al. |
| 2004/0124475 A1 | 7/2004 | Pelham et al. |
| 2004/0128631 A1 | 7/2004 | Ditzel et al. |
| 2004/0128636 A1 | 7/2004 | Ishikura |
| 2004/0178493 A1 | 9/2004 | Correale, Jr. |
| 2004/0216074 A1 | 10/2004 | Hart et al. |
| 2005/0127428 A1 | 6/2005 | Mokhlesi et al. |
| 2006/0026551 A1 | 2/2006 | Shrowty et al. |
| 2006/0102958 A1 | 5/2006 | Masleid |
| 2006/0277520 A1 | 12/2006 | Gennari |
| 2006/0282798 A1 | 12/2006 | Beattie et al. |
| 2007/0038430 A1 | 2/2007 | Walker et al. |
| 2007/0300191 A1 | 12/2007 | Beattie et al. |
| 2009/0031261 A1 | 1/2009 | Smith et al. |

* cited by examiner

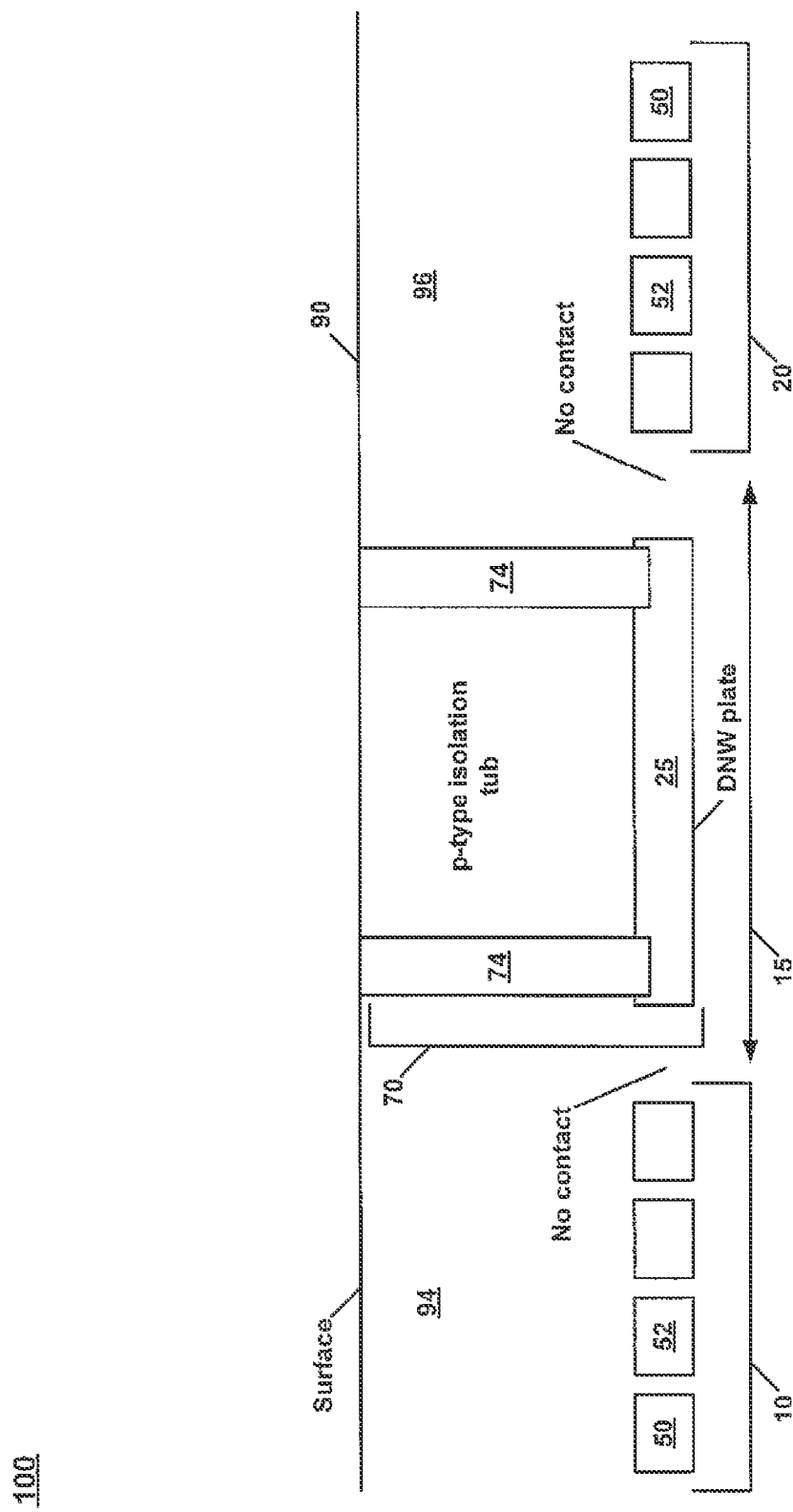

US 9,406,601 B2

BODY-BIAS VOLTAGE ROUTING STRUCTURES

RELATED APPLICATIONS

This application is a Continuation of co-pending, commonly-owned U.S. patent application Ser. No. 12/140,197, now U.S. Pat. No. 8,633,547, filed Jun. 16, 2008, which in turn was a Divisional application of U.S. patent application Ser. No. 10/816,269, now U.S. Pat. No. 7,388,260, filed on Mar. 31, 2004, to Masleid et al., titled "Structure for Spanning Gap in Body-Bias Voltage Routing Structure." All such applications are incorporated herein by reference in their entirety.

FIELD OF INVENTION

The present invention generally relates to semiconductor chips and MOSFETS (metal oxide semiconductor field effect transistors). More particularly, the present invention relates to the field of spanning gaps in the body-bias voltage routing structure to the MOSFETS.

BACKGROUND

Generation of the physical layout of a semiconductor device having MOSFETS (metal oxide semiconductor field effect transistors) formed on a semiconductor substrate is a challenging task. An extensive amount of time and resources are spent during the creation of the physical layout. However, consumption of resources can be minimized if new physical layouts utilize substantial portions of existing physical layouts. For example, a new physical layout having MOSFETS that are body-biased would be less expensive to generate if an existing physical layout having MOSFETS without body-bias is utilized and modified according to the needs of the new physical design. Unfortunately, this process of modifying the existing physical layout typically requires forming an additional routing layer for the body-bias voltage on the surface of the semiconductor device, creating a serious issue since the existing physical layout utilizes most, if not all, available surface area.

SUMMARY OF THE INVENTION

Embodiments of the present invention are directed to structures for body-bias voltage routing.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIG. 10 illustrates a cross-sectional view of the semiconductor device of FIG. 9A along line A-B in accordance with an embodiment of the present invention.

DETAILED DESCRIPTION

Reference will now be made in detail to embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details.

Although the following description of the present invention will focus on routing a body-bias voltage to pFETS (or p-type MOSFETS) formed in surface N-wells via a conductive sub-surface region of N-type doping when a p-type substrate and an N-well process are utilized, the present invention is equally applicable to routing a body-bias voltage to nFETS (or n-type MOSFETS) formed in surface P-wells via a conductive sub-surface region of P-type doping when an n-type substrate and a P-well process are utilized.

Body-Bias Voltage Routing Structures

Figure 1:
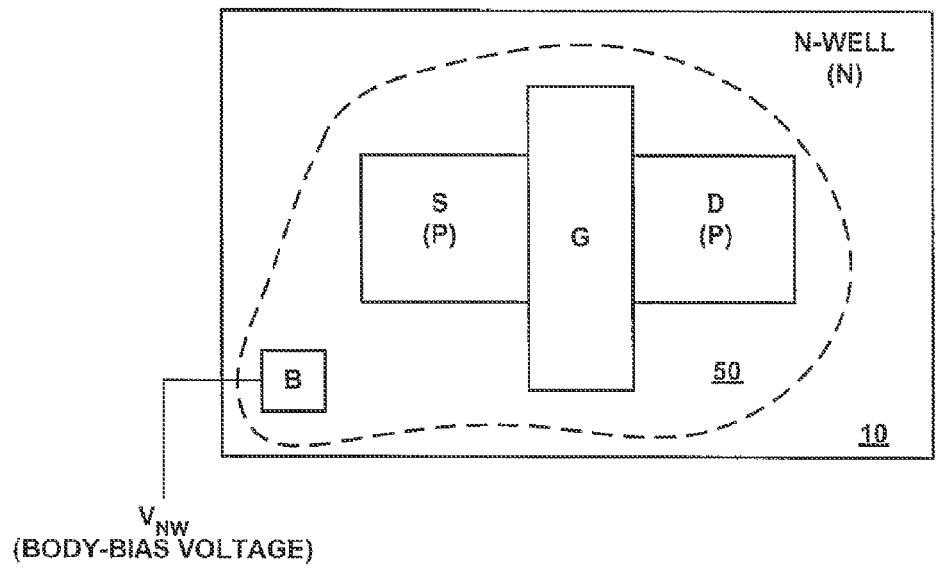
FIG. 1 illustrates a top view of a pFET formed in an N-well in accordance with an embodiment of the present invention, showing the pFET having a body-bias voltage Vnw applied to its bulk/body B terminal.

FIG. 1 illustrates a top view of a pFET 50 (or p-type MOSFET) formed in an N-well 10 when a p-type substrate and an N-well process are utilized in accordance with an embodiment of the present invention, wherein pFET 50 has a body-bias voltage Vnw applied to its bulk/body B terminal. As depicted in FIG. 1, pFET 50 has gate G, drain D (p-type doping), source S (p-type doping), and bulk/body B terminals. In particular, bulk/body B terminal is coupled to N-well 10. Hence, a voltage applied to bulk/body B terminal is received by N-well 10. The N-well has an n-type doping. Regions of a semiconductor device that are doped with an n-type dopant have one type of conductivity while regions that are doped with a p-type dopant have another type of conductivity. Typically, various dopant concentrations are utilized in different regions of the semiconductor device.

The pFET 50 is body-biased to influence its performance. Without body-biasing, the source S and bulk/body B terminals may be coupled together. With body-biasing, the source S and bulk/body B terminals are not coupled together. Body-biasing enables controlling the potential difference between the source S and bulk/body B terminals of the pFET 50, providing the ability to electrically tune the threshold voltage level of the pFET 50.

In the case of body-biasing, bulk/body B terminal receives a body-bias voltage Vnw. As described above, bulk/body B terminal represents a connection to N-well 10. Thus, the body-bias voltage Vnw is applied to N-well 10.

Instead of generating an entire new physical layout for a semiconductor device to support pFET 50 having the body-bias voltage Vnw, an existing physical layout can be modified. In particular, the existing physical layout is modified by including a deep N-well region to route the body-bias voltage Vnw to N-wells 10 which generally are separated by P-well regions, wherein deep N-well represents a conductive sub-surface well layer that is beneath the surface N-well 10. This avoids having to create another surface routing layer on a surface of the semiconductor device that does not have much free surface area for additional routing.

Several layout patterns for the deep N-well region are described herein. These layout patterns facilitate routing the body-bias voltage in the semiconductor device. The layout patterns include a diagonal sub-surface mesh structure (see FIG. 5A), an axial sub-surface mesh structure (see FIG. 7), a diagonal sub-surface strip structure (see FIG. 6A and FIG. 6B), and an axial sub-surface strip structure (see FIG. 8A and FIG. 8B). A particular layout pattern is selected for an area of the semiconductor device according to several factors as will be described below. Once the particular layout pattern is selected, the layout for the deep N-well region can be generated in an automated manner.

The body-bias voltage Vnw is routed to the N-wells via one or more deep N-well regions (which are conductive sub-surface well layers) as opposed to surface metal layers. In one embodiment, the deep N-well region is a diagonal deep N-well region as will be described below. In another embodiment, the deep N-well region is an axial deep N-well region as will be described below. The advantage of this approach is that while typically there is little or no room on the densely packed surface area of the semiconductor device for extra metal routing layers, the area beneath the surface of the semiconductor device is often underutilized due to the fact that routing signals through wells is generally prohibited by the poor frequency response and potentially unfavorable resistance of the wells. In the present invention, rather than carrying signals, the deep N-well regions serve to hold and distribute the body-bias voltage Vnw.

Figure 2A:
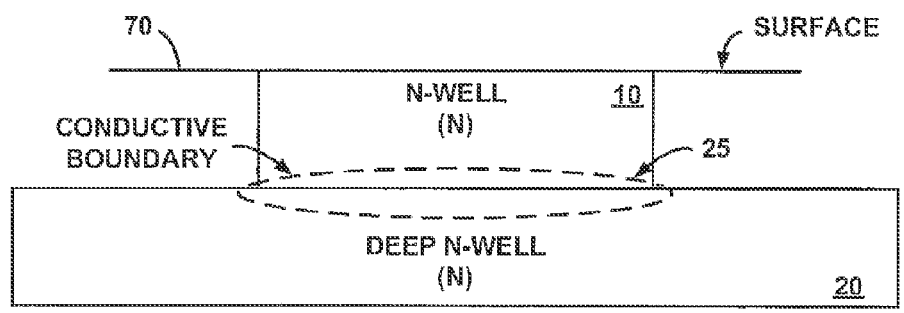
FIG. 2A illustrates the relative positioning of an N-well and a deep N-well region beneath a surface of a semiconductor device in accordance with an embodiment of the present invention.

FIG. 2A illustrates the relative positioning of an N-well 10 (also known as a surface N-well) and a deep N-well region 20 beneath a surface 70 of a semiconductor device in accordance with an embodiment of the present invention. N-well 10 is formed beneath surface 70 of the semiconductor device and has an N-type doping. Deep N-well region 20 is formed beneath N-well 10 such that deep N-well region 20 and N-well 10 share a sub-surface conductive boundary 25 that allows deep N-well region 20 to function like a conductive sub-surface routing layer for routing the body-bias voltage Vnw to the N-wells. That is, deep N-well region 20 contacts N-well 10 along the sub-surface conductive boundary 25. Moreover, deep N-well region 20 is buried under surface 70 of the semiconductor device. Deep N-well region 20 has an N-type doping. It should be understood that if an n-type substrate and a P-well process were utilized, a deep well of P-type doping would be utilized to function as a conductive sub-surface routing layer for routing the body-bias voltage to the surface P-wells.

The dimensions and size of the sub-surface conductive boundary 25 determine the resistance of the conductive path between N-well 10 and deep N-well region 20. As the size of sub-surface conductive boundary 25 is increased, the resistance of sub-surface conductive path between N-well 10 and deep N-well region 20 is lowered to create a low-resistance conductive path.

Figure 2B:
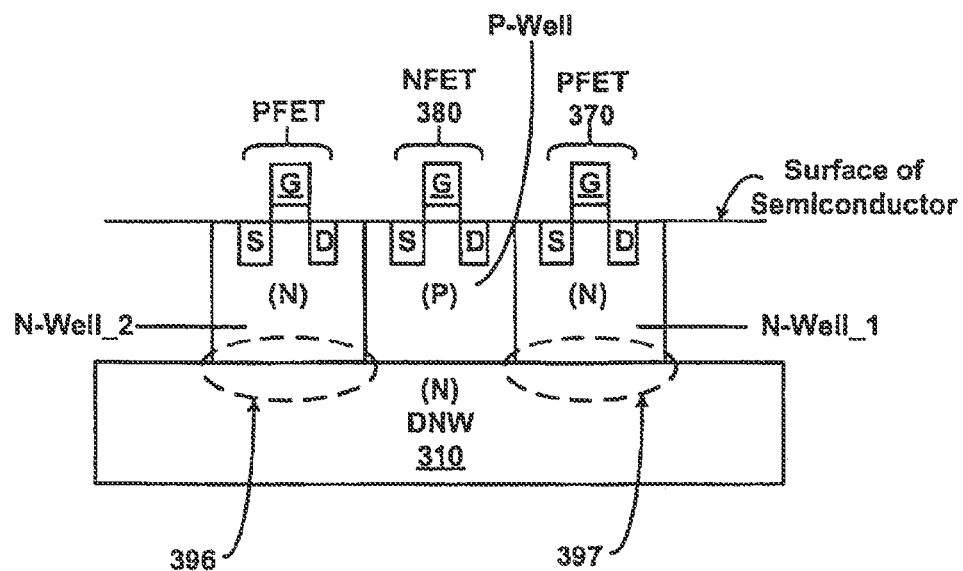
FIG. 2B illustrates a side view of a deep N-well region coupled to N-well_1 and N-well_2 in accordance with an embodiment of the present invention, showing the routing of the body-bias voltage.

FIG. 2B illustrates a side view of a deep N-well region coupled to N-well_1 and N-well_2 in accordance with an embodiment of the present invention, showing the routing of the body-bias voltage. As illustrated in FIG. 2B, there is a first sub-surface conductive boundary 396 between N-well_1 and deep N-well region 310. Moreover, there is a second sub-surface conductive boundary 397 between N-well_2 and deep N-well region 310. Surface N-well_1 has a PFET 370. Also, surface N-well_2 has a PFET 370. The P-well region has an NFET 380 and separates N-well_1 and N-well_2. The body-bias voltage Vnw is routed to N-well_1 and N-well_2 via the first and second sub-surface conductive boundaries 396 and 397.

Figure 3A:
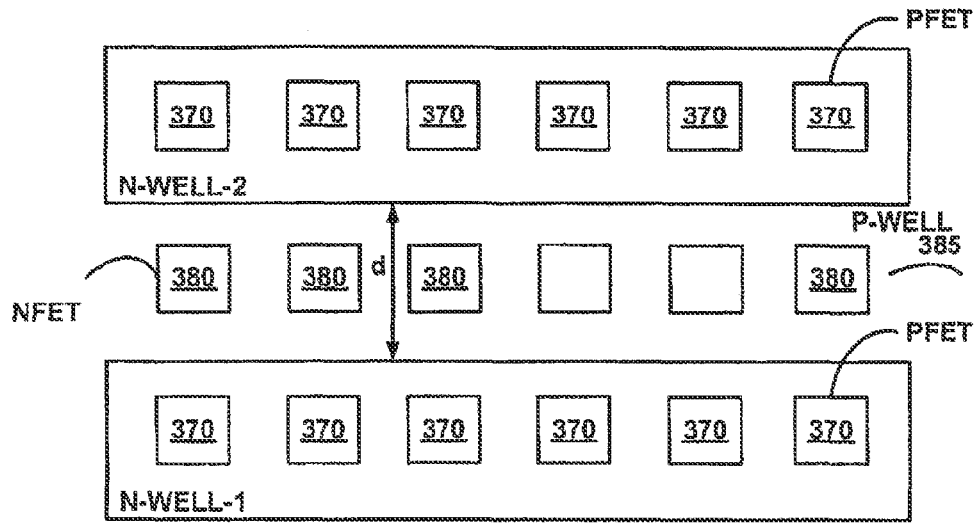
FIG. 3A illustrates a top view of N-well_1 and N-well_2 in accordance with an embodiment of the present invention.

A top view of N-well_1 and N-well_2 in accordance with an embodiment of the present invention is illustrated in FIG. 3A. As depicted in FIG. 3A, N-well_1 and N-well_2 have an axial orientation. That is, N-well_1 and N-well_2 are positioned along an axis (e.g., x-axis). N-well_1 and N-well_2 have an N-type doping. The body-bias voltage Vnw is routed to N-well_1 and N-well_2 so that pFETs 370 can be body-biased via the deep N-well region. Thus, a contact for the body-bias voltage Vnw can be formed wherever there is free surface area, such as above N-well_1, N-well_2, or deep N-well region. Since N-well_1 and N-well_2 are separated by a P-type region or P-well region 385 on which nFETS 380 are formed, the layout pattern of the deep N-well is carefully selected to avoid isolating the P-type region or P-well region 385 on which nFETS 380 are formed, allowing the formation of conductive paths between P-well region 385 and a subsurface layer (e.g., doped with P-type material) that is formed beneath the deep N-well region. Here, N-well_1 and N-well_2 are separated by the length d.

Figure 3B:
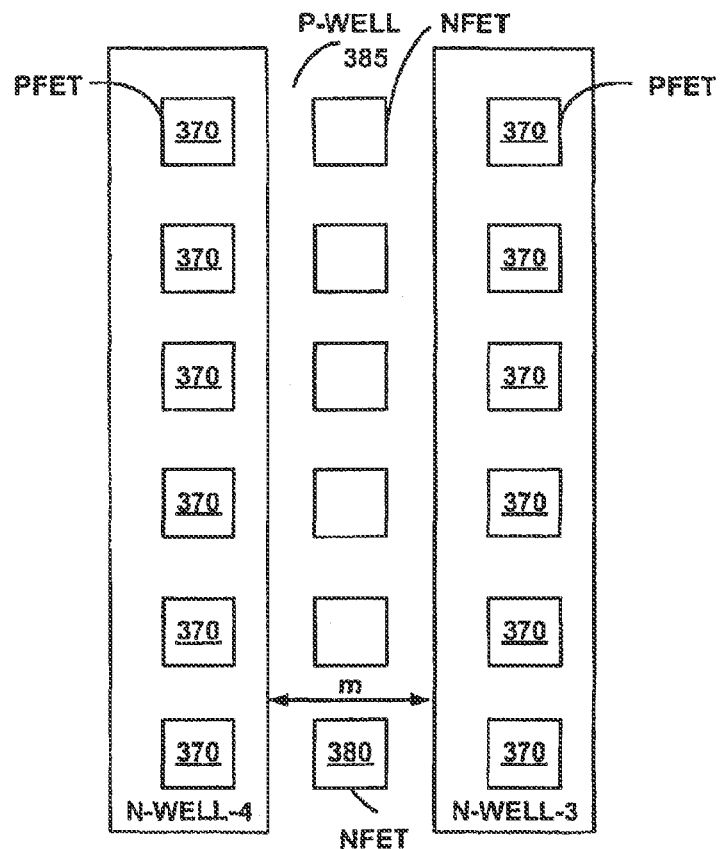
FIG. 3B illustrates a top view of N-well_3 and N-well_4 in accordance with an embodiment of the present invention.

FIG. 3B illustrates a top view of N-well_3 and N-well_4 in accordance with an embodiment of the present invention. As depicted in FIG. 3B, N-well_3 and N-well_4 also have an axial orientation. That is, N-well_3 and N-well_4 are positioned along an axis (e.g., y-axis). N-well_3 and N-well_4 have an N-type doping. The body-bias voltage Vnw is routed to N-well_3 and N-well_4 so that pFETs 370 can be body-biased via the deep N-well region. Thus, a contact for the body-bias voltage Vnw can be formed wherever there is free surface area, such as above N-well_3, N-well_4, or deep N-well region. Since N-well_3 and N-well_4 are separated by a P-type region or P-well region 385 on which nFETS 380 are formed, the layout pattern of the deep N-well is carefully selected to avoid isolating the P-type region or P-well region 385 on which nFETS 380 are formed, allowing the formation of conductive paths between P-well region 385 and a subsurface layer (e.g., doped with P-type material) that is formed beneath the deep N-well region. Here, N-well_3 and N-well_4 are separated by the length m.

Figure 4:
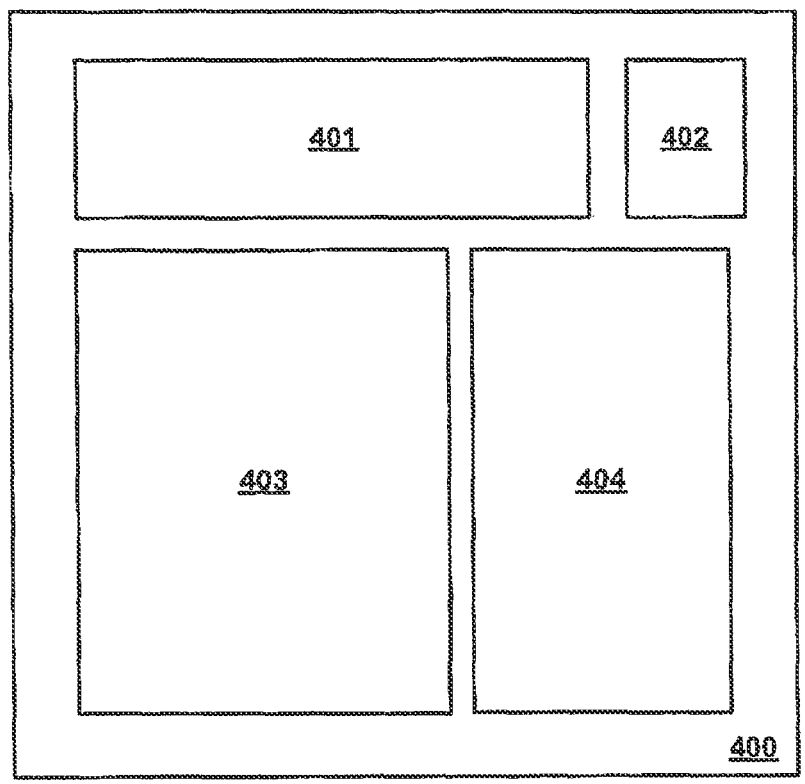
FIG. 4 illustrates a top view of a semiconductor device in accordance with an embodiment of the present invention, showing multiple areas each area corresponding to a separate layout pattern for the deep N-well.

FIG. 4 illustrates a top view of a semiconductor device 400 in accordance with an embodiment of the present invention, showing multiple areas 401-404, each area corresponding to a separate layout pattern for the deep N-well. In general, the layout distribution of surface N-wells and surface P-type regions or P-wells on semiconductor device 400 is characterized by particular patterns. Semiconductor device 400 can be divided according to these particular patterns into multiple areas 401-404. Alternatively, semiconductor device 400 may have a single layout distribution of surface N-wells and surface P-type regions or P-wells.

Once the layout patterns of the surface N-wells and surface P-type regions or P-wells are recognized, a layout pattern for the deep N-well region can be selected for the particular area. The layout patterns for the deep N-well region include a diagonal sub-surface mesh structure (see FIG. 5A), an axial sub-surface mesh structure (see FIG. 7), a diagonal sub-surface strip structure (see FIG. 6A and FIG. 6B), and an axial sub-surface strip structure (see FIG. 8A and FIG. 8B). The factors evaluated in selecting a particular layout pattern for the deep N-well region include: providing a low resistance conductive path for routing the body-bias voltage and avoiding the isolation of the P-type region or P-well region 385 (FIGS. 3A and 3B) on which nFETS 380 are formed to allow the formation of conductive paths between P-well region 385 and a sub-surface layer (e.g., doped with P-type material) that is formed beneath the deep N-well region.

Moreover, the primary factors in determining which particular layout pattern for the deep N-well region to use are the type of layout pattern (e.g., horizontal strips or vertical strips) of surface N-wells (see FIGS. 3A and 3B)) and the separation length between adjacent surface N-wells (e.g., separation length d in FIG. 3A, and separation length m in FIG. 3B). Since each type of layout pattern of surface N-wells (see FIGS. 3A and 3B) exhibits unique characteristics, a layout pattern for the deep N-well region is selected that is appropriate for those characteristics exhibited by the layout pattern of the surface N-wells. Within each area 401-404, adjustments to the layout pattern of the deep N-well can be made to overcome any violations of the layout design rules and to improve the factors described above.

Figure 5A:
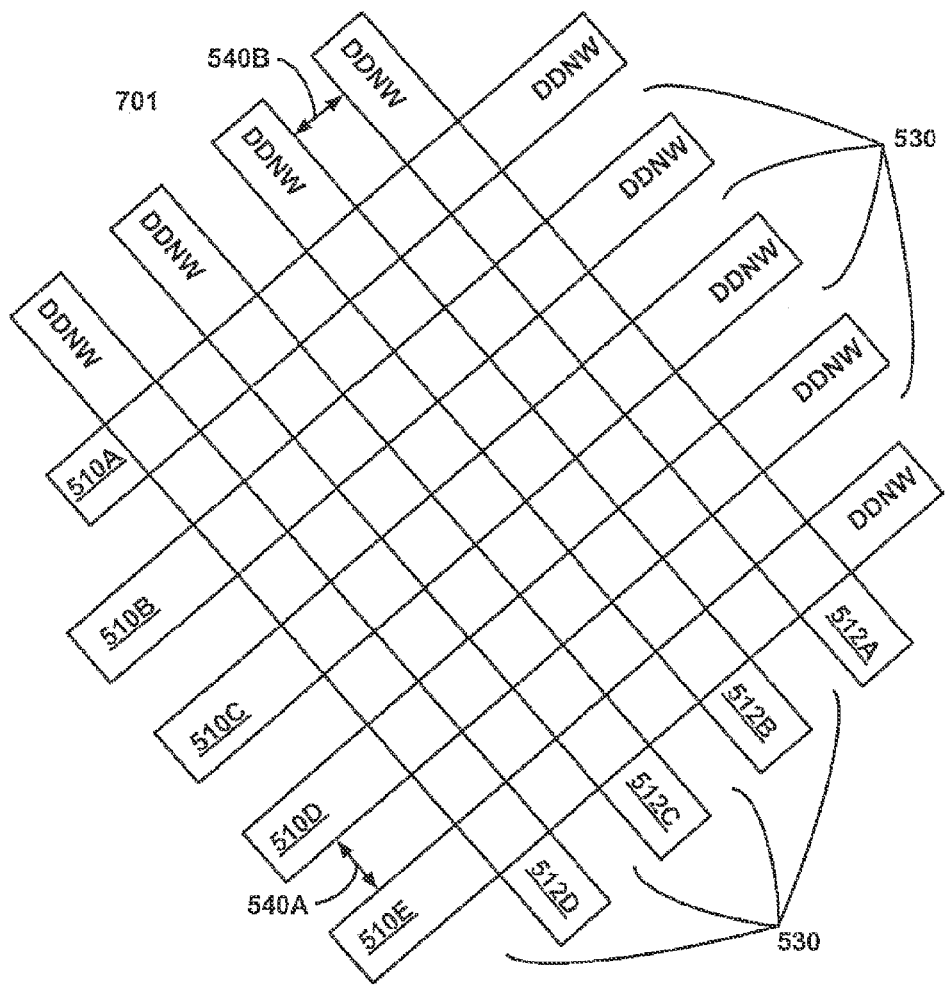
FIG. 5A illustrates a top view of multiple diagonal deep N-well (DDNW) regions forming a diagonal sub-surface mesh structure in accordance with an embodiment of the present invention.

FIG. 5A illustrates a top view of multiple diagonal deep N-well (DDNW) regions forming a diagonal sub-surface mesh structure 500 in accordance with an embodiment of the present invention. Rather than having a continuous planar layer for the deep N-well, multiple diagonal deep N-well (DDNW) regions are patterned according to a layout pattern. As depicted in FIG. 5A, each diagonal deep N-well region 510A-510E and 512A-512D has a strip shape, is formed beneath the surface N-well layer of a semiconductor device, and is doped with an N-type material. Diagonal deep N-well regions 510A-510E are formed in a first parallel orientation while diagonal deep N-well regions 512A-512D are formed in a second parallel orientation. The first parallel orientation and the second parallel orientation are orthogonal to each other and are diagonal (or slanted) with respect to N-well regions of FIGS. 3A and 3B. In an embodiment, the first parallel orientation and N-well regions of FIGS. 3A and 3B form an angle that is approximately 45 degrees. Additionally, in an embodiment, the second parallel orientation and N-well regions of FIGS. 3A and 3B form an angle that is approximately 45 degrees. Thus, diagonal deep N-well regions 510A-510E and 512A-512D form a diagonal sub-surface mesh structure 500 for routing the body-bias voltage Vnw to the N-well regions so that pFETs can be body-biased.

As described above with respect to FIGS. 2A and 2B, the layer corresponding to the deep N-well region is below the layer corresponding to the surface N-well regions. Hence, sub-surface conductive boundaries can be formed between N-well regions and diagonal sub-surface mesh structure 500 to provide a plurality of sub-surface conductive paths between N-well regions without isolating the P-well region located between N-wells. That is, diagonal sub-surface mesh structure 500 contacts N-wells along the sub-surface conductive boundaries (e.g., sub-surface conductive boundary 25 (FIG. 2A) and sub-surface conductive boundaries 396 and 397 (FIG. 2B)).

The orientation of diagonal sub-surface mesh structure 500 is diagonal with respect to the orientation of N-well regions of FIGS. 3A and 3B. In an embodiment, diagonal sub-surface mesh structure 500 is rotated approximately 45 degrees with respect to N-well regions of FIGS. 3A and 3B. It should be understood that diagonal sub-surface mesh structure 500 can have other configurations. For example, gaps 540A and 540B between adjacent diagonal deep N-well regions can vary in size. Moreover, the ratio of diagonal deep N-well regions to gap area 430 can vary.

Additionally, diagonal sub-surface mesh structure 500 enables nFETS (n-type MOSFETS) 380 (FIGS. 3A and 3B) to be body-biased in any manner by preventing isolation of a P-type region or P-well region 385 (FIGS. 3A and 3B) on which nFETS 380 are formed. Gap area 530 between diagonal deep N-well regions 510A-510E and 512A-512D prevents isolation of P-well region 385 and enables a conductive path between P-well region 385 and a sub-surface layer that is beneath diagonal deep N-well regions 510A-510E and 512A-512D. In an embodiment, the area of diagonal sub-surface mesh structure 500 is equally divided between diagonal deep N-well regions (e.g., 510A-510E and 512A-512D) and gap area 530.

As discussed above, a contact for the body-bias voltage Vnw can be formed wherever there is free space, such as above N-well regions or above diagonal deep N-well regions 510A-510E and 512A-512D. Moreover, the location and size of the diagonal sub-surface mesh structure 500 is based on the distribution of the N-wells and the P-type regions or P-wells, wherein the goal is to provide low resistance conductive paths for the body-bias voltage Vnw.

However, the size of diagonal sub-surface mesh structure 500 should avoid isolating P-type regions or P-wells 385 (FIGS. 3A and 3B) from sub-surface layers that are formed beneath diagonal deep N-well regions 510A-510E and 512A-512D. Moreover, gap area 530 is sized so as to provide a low-resistance conductive path between P-type regions or P-wells 385 and a sub-surface layer that is formed beneath diagonal deep N-well regions, wherein the greater the gap area 530 the lower the resistance of this conductive path. Additionally, lateral diffusion and lateral depletion can further reduce gap area 530, potentially pinching-off this conductive path between P-type regions or P-wells 385 and a sub-surface layer that is formed beneath diagonal deep N-well regions. As a solution to this situation, gaps 540A and 540B between adjacent diagonal deep N-well regions are made sufficiently wide to avoid pinching-off this conductive path between P-type regions or P-wells 385 and a sub-surface layer that is formed beneath diagonal deep N-well regions. Yet, as the number and size of the diagonal deep N-well regions are increased, the resistance of the conductive path for routing the body-bias voltage Vnw is decreased because there are larger and more sub-surface conductive boundaries between N-well regions and diagonal deep N-well regions. Hence, there is a trade-off between gap area 530 and diagonal deep N-well regions in each design situation.

Figure 5B:
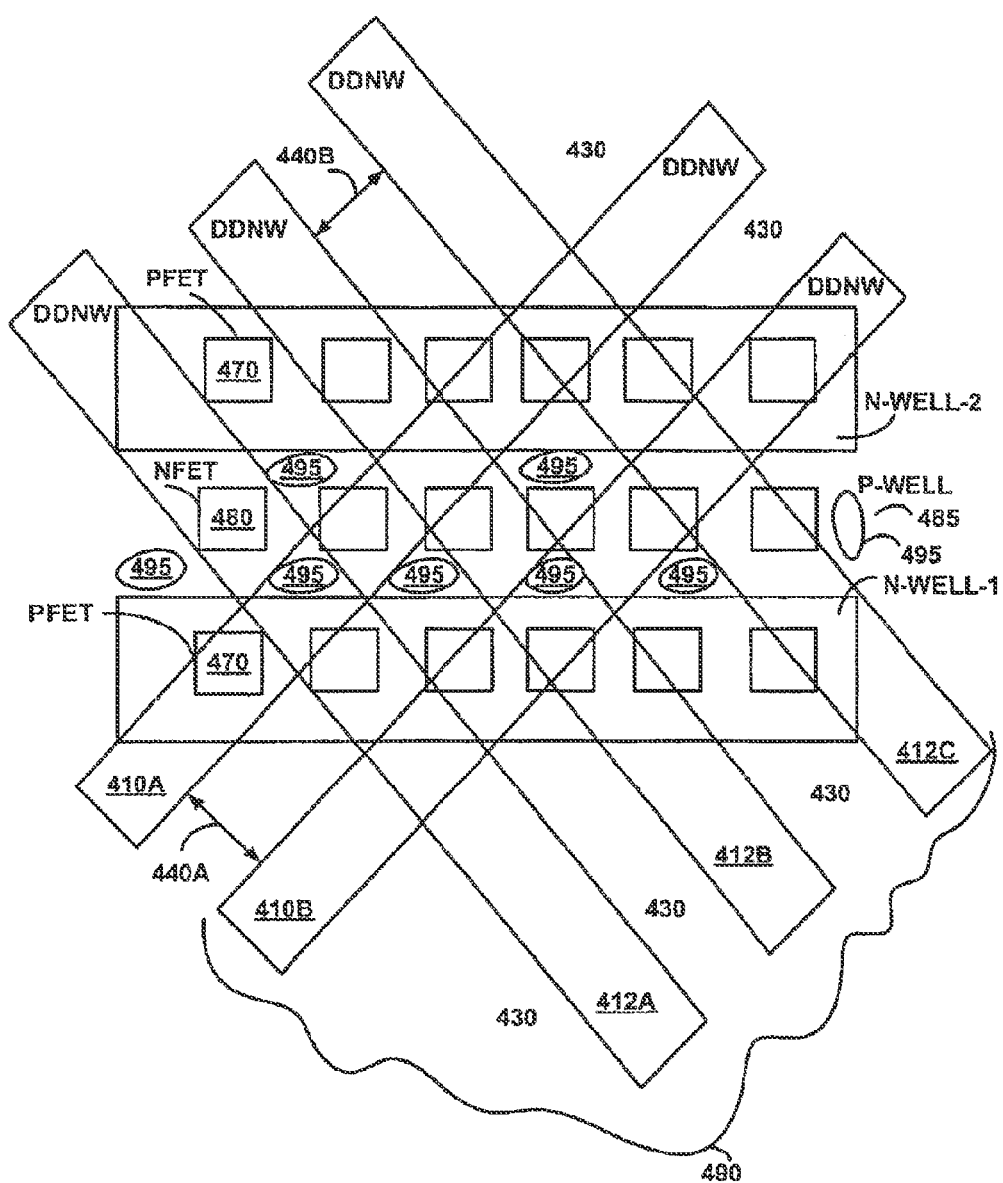
FIG. 5B illustrates a top view of multiple N-wells and multiple diagonal deep N-well (DDNW) regions forming a diagonal sub-surface mesh structure in accordance with an embodiment of the present invention.

FIG. 5B illustrates a top view of multiple N-wells (e.g., N-well_1 and N-well_2) and multiple diagonal deep N-well (DDNW) regions forming a diagonal sub-surface mesh structure in accordance with an embodiment of the present invention. Here, diagonal deep N-well regions 410A and 410B are orthogonal to diagonal deep N-well regions 412A, 412B, and 412C. Thus, diagonal deep N-well regions 412A, 412B, 412C, 410A, and 410B form a diagonal sub-surface mesh structure 490 for routing the body-bias voltage Vnw to N-well_1 and N-well_2 so that pFETs 470 can be body-biased. In an embodiment, the area of diagonal sub-surface mesh structure 490 is equally divided between diagonal deep N-well regions and gap area 430.

It should be understood that diagonal sub-surface mesh structure 490 can have other configurations. Gaps 440A and 440B between adjacent diagonal deep N-well regions can vary in size. Moreover, the ratio of diagonal deep N-well regions to gap area 430 can vary. The regions 495 between diagonal deep N-well regions prevent isolation of P-well region 485 and enable a conductive path between P-well region 485 and a sub-surface layer that is beneath diagonal deep N-well regions 412A, 412B, 412C, 410A, and 410B.

Figure 6A:
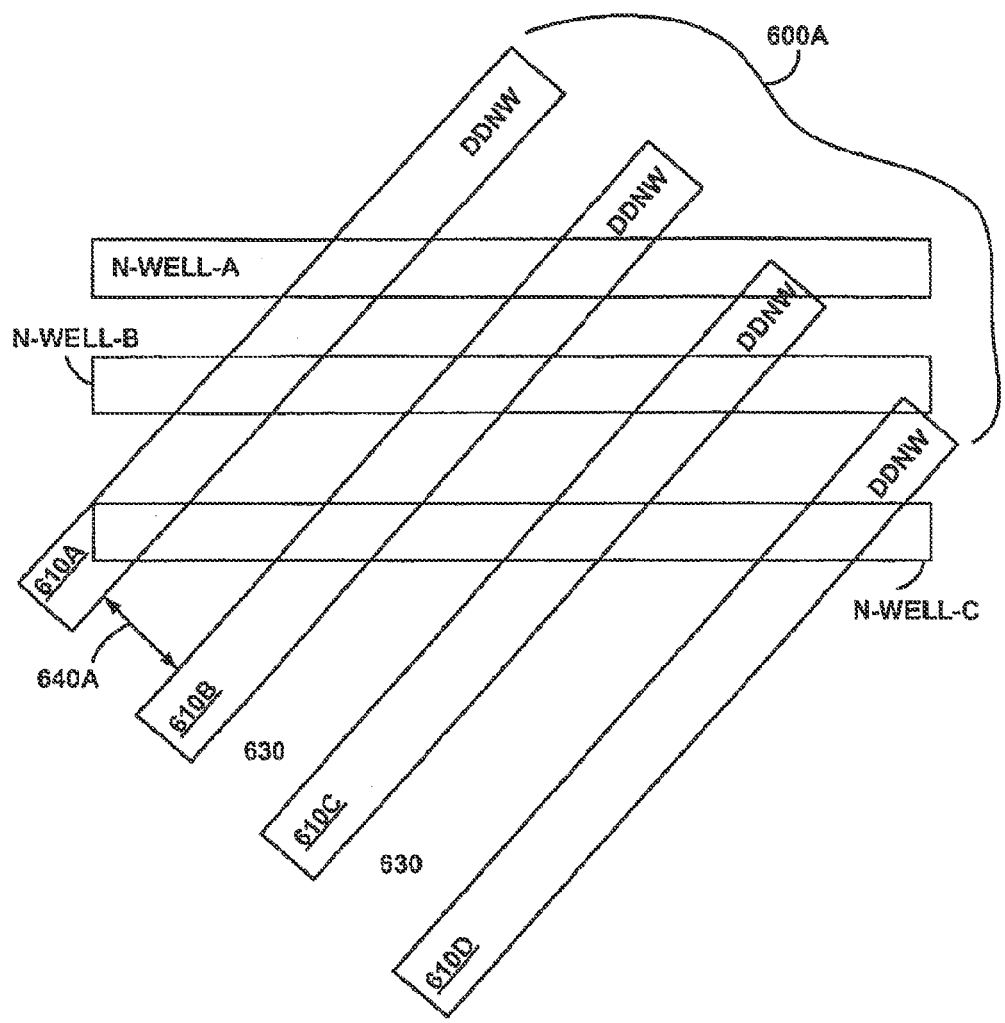
FIG. 6A illustrates a top view of multiple diagonal deep N-well (DDNW) regions forming a first diagonal sub-surface strip structure in accordance with an embodiment of the present invention.

A top view of multiple diagonal deep N-well (DDNW) regions forming a first diagonal sub-surface strip structure 600A in accordance with an embodiment of the present invention is illustrated in FIG. 6A. In this layout pattern, each diagonal deep N-well region 610A-610D has a strip shape, is formed beneath the surface N-well layer of a semiconductor device, and is doped with an N-type material. Diagonal deep N-well regions 610A-610D are formed in a first parallel orientation. The first parallel orientation is diagonal (or slanted) with respect to surface N-well regions (e.g., N-well_A, N-well_B, and N-well_C). In an embodiment, the first parallel orientation and the N-well regions form an angle that is approximately 45 degrees. In this case, the combination of surface N-well regions (e.g., N-well_A, N-well_B, and N-well_C) and the first diagonal sub-surface strip structure 600A forms a mesh-type arrangement for routing the body-bias voltage to surface N-well regions so that pFETs can be body-biased.

As described above with respect to FIGS. 2A and 2B, the layer corresponding to the deep N-well region is below the layer corresponding to the surface N-well regions. Hence, sub-surface conductive boundaries can be formed between N-well regions and first diagonal sub-surface strip structure 600A to provide a plurality of sub-surface conductive paths between N-well regions without isolating P-well region located between N-wells. That is, first diagonal sub-surface strip structure 600A contacts N-wells along the sub-surface conductive boundaries (e.g., sub-surface conductive boundary 25 (FIG. 2A) and sub-surface conductive boundaries 396 and 397 (FIG. 2B)).

As described above, the combination of surface N-well regions (e.g., N-well_A, N-well_B, and N-well_C) and diagonal deep N-well regions 610A-610D, which form the first diagonal sub-surface strip structure 600A, facilitate the routing of the body-bias voltage Vnw to N-well regions so that pFETs can be body-biased. First diagonal sub-surface strip structure 600A can be utilized in areas of the semiconductor device that have a dense layout such as areas corresponding to an SRAM (static random access memory). It should be understood that first diagonal sub-surface strip structure 600A can have other configurations. Gap 640A between adjacent diagonal deep N-well regions can vary in size. Moreover, the ratio of diagonal deep N-well regions to gap area 630 can vary.

Figure 6B:
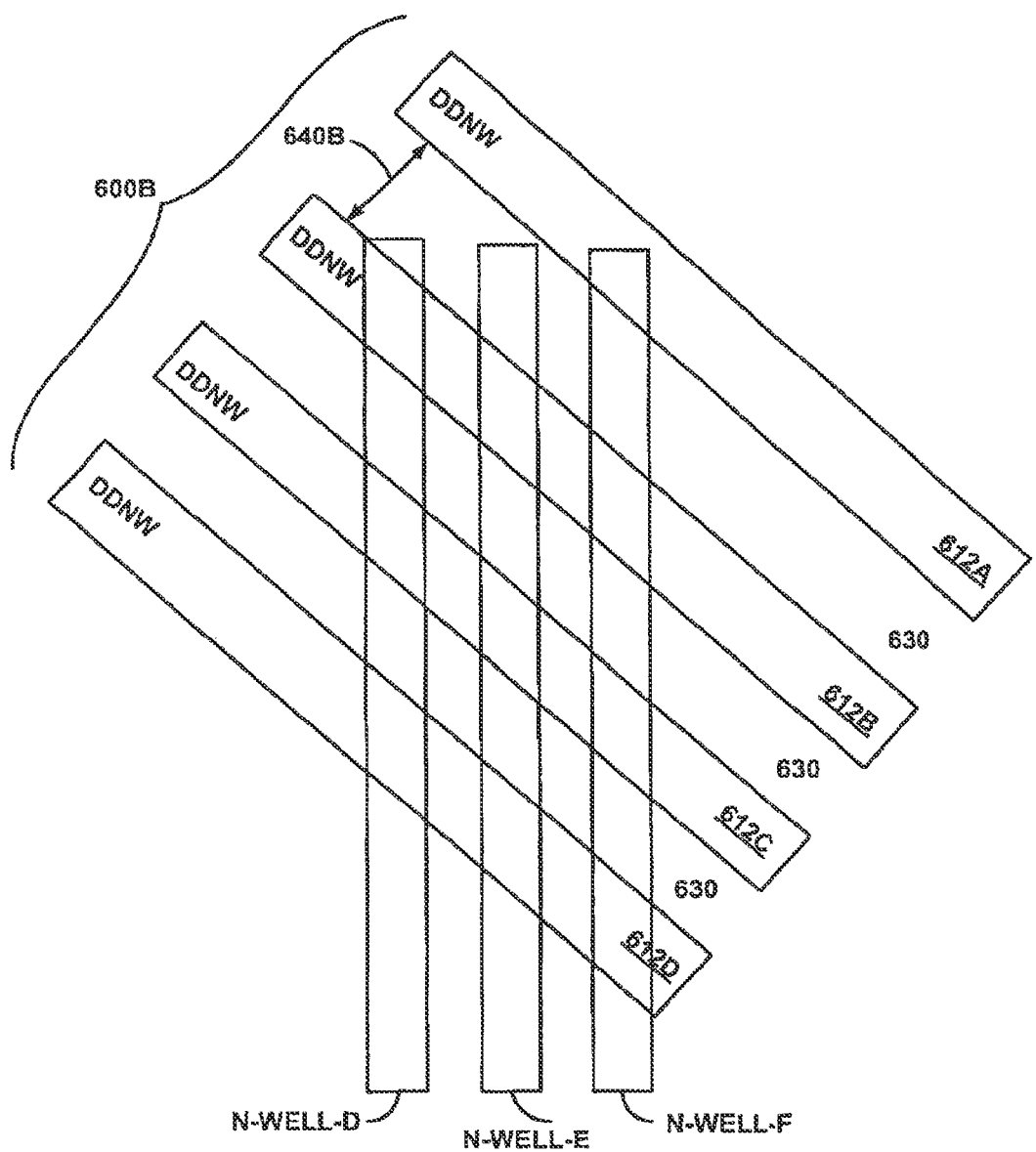
FIG. 6B illustrates a top view of multiple diagonal deep N-well (DDNW) regions forming a second diagonal sub-surface strip structure in accordance with an embodiment of the present invention.

FIG. 6B illustrates a top view of multiple diagonal deep N-well (DDNW) regions forming a second diagonal sub-surface strip structure 600B in accordance with an embodiment of the present invention. In this layout pattern, each diagonal deep N-well region 612A-612D has a strip shape, is formed beneath the surface N-well layer of a semiconductor device, and is doped with an N-type material. Diagonal deep N-well regions 612A-612D are formed in a second parallel orientation. The second parallel orientation is diagonal (or slanted) with respect to surface N-well regions (e.g., N-well_D, N-well_E, and N-well_F). In an embodiment, the second parallel orientation and N-well regions form an angle that is approximately 45 degrees. In this case, the combination of surface N-well regions (e.g., N-well_D, N-well_E, and N-well_F) and second diagonal sub-surface strip structure 600B forms a mesh-type arrangement for routing the body-bias voltage to surface N-well regions so that pFETs can be body-biased.

As described above with respect to FIGS. 2A and 2B, the layer corresponding to the deep N-well region is below the layer corresponding to the surface N-well regions. Hence, sub-surface conductive boundaries can be formed between N-well regions and second diagonal sub-surface strip structure 600B to provide a plurality of sub-surface conductive paths between N-well regions without isolating P-well region located between N-wells. That is, second diagonal sub-surface strip structure 600B contacts N-wells along the sub-surface conductive boundaries (e.g., sub-surface conductive boundary 25 (FIG. 2A) and sub-surface conductive boundaries 396 and 397 (FIG. 2B)).

As described above, the combination of surface N-well regions (e.g., N-well_D, N-well_E, and N-well_F) and diagonal deep N-well regions 612A-612D, which form the second diagonal sub-surface strip structure 600B, facilitate routing of the body-bias voltage Vnw to N-well regions so that pFETs can be body-biased. Second diagonal sub-surface strip structure 600B can be utilized in areas of the semiconductor device that have a dense layout such as areas corresponding to an SRAM (static random access memory). It should be understood that second diagonal sub-surface strip structure 600B can have other configurations. Gap 6408 between adjacent diagonal deep N-well regions can vary in size. Moreover, the ratio of diagonal deep N-well regions to gap area 630 can vary.

Figure 7:
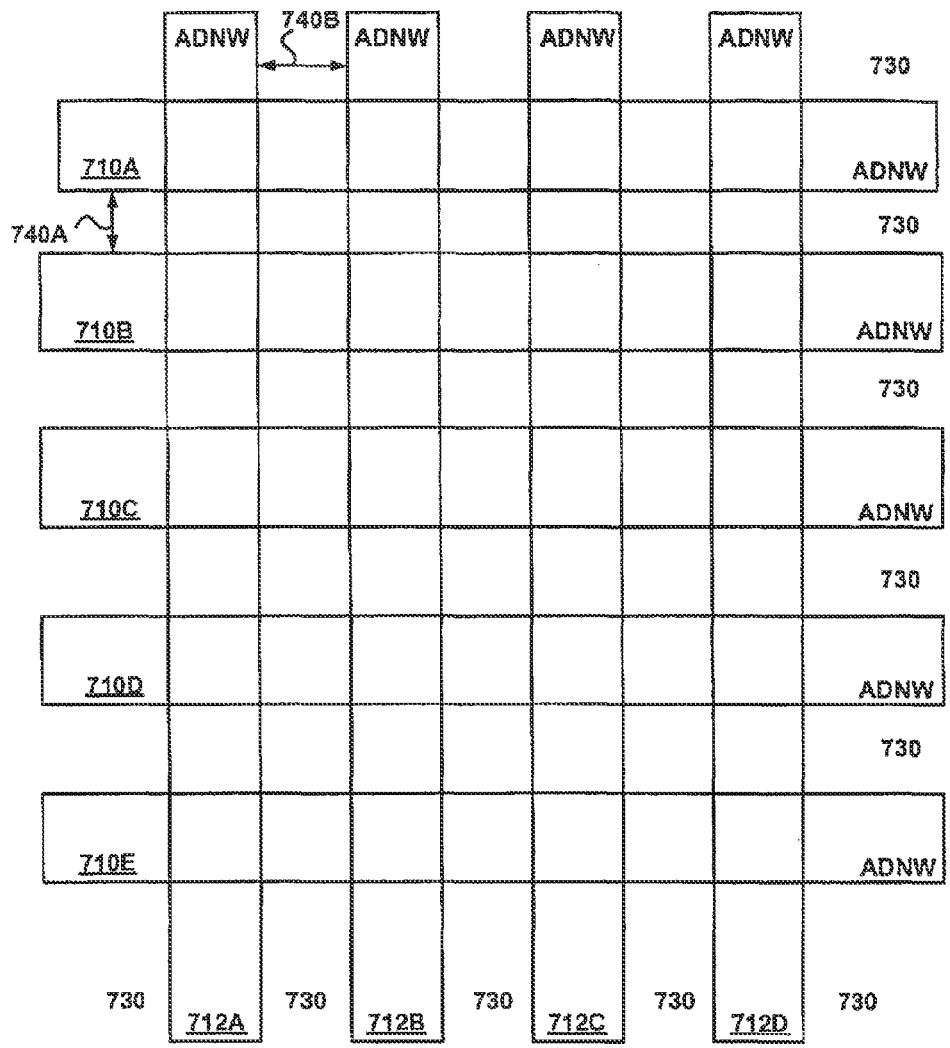
FIG. 7 illustrates a top view of multiple axial deep N-well (ADNW) regions forming an axial sub-surface mesh structure in accordance with an embodiment of the present invention.

FIG. 7 illustrates a top view of multiple axial deep N-well (ADNW) regions forming an axial sub-surface mesh structure 700 in accordance with an embodiment of the present invention. As depicted in FIG. 7, each axial deep N-well region 710A-710E and 712A-712D has a strip shape, is formed beneath the surface N-well layer of a semiconductor device, and is doped with an N-type material. Axial deep N-well regions 710A-710E are formed in a first parallel orientation while diagonal deep N-well regions 712A-712D are formed in a second parallel orientation. The first parallel orientation and the second parallel orientation are orthogonal to each other and are axially positioned with respect to N-well regions of FIGS. 3A and 3B. That is, the first parallel orientation and the second parallel orientation are oriented along an axis (e.g., y-axis or x-axis) in the same manner as N-well regions of FIGS. 3A and 3B. In an embodiment, the first parallel orientation is parallel to N-well regions of FIG. 3A and is perpendicular to N-well regions of FIG. 3B. Additionally, in an embodiment, the second parallel orientation is parallel to N-well regions of FIG. 3B and is perpendicular to N-well regions of FIG. 3A. Thus, axial deep N-well regions 710A-710E and 712A-712D form an axial sub-surface mesh structure 700 for routing the body-bias voltage Vnw to N-well regions so that pFETs can be body-biased.

As described above with respect to FIGS. 2A and 2B, the layer corresponding to the deep N-well region is below the layer corresponding to the surface N-well regions. Hence, sub-surface conductive boundaries can be formed between N-well regions and axial sub-surface mesh structure 700 to provide a plurality of sub-surface conductive paths between N-well regions without isolating P-well region located between N-wells. That is, axial sub-surface mesh structure 700 contacts N-wells along the sub-surface conductive boundaries (e.g., sub-surface conductive boundary 25 (FIG. 2A) and sub-surface conductive boundaries 396 and 397 (FIG. 2B)).

It should be understood that axial sub-surface mesh structure 700 can have other configurations. For example, gaps 740A and 740B between adjacent axial deep N-well regions can vary in size. Moreover, the ratio of axial deep N-well regions to gap area 730 can vary.

Additionally, axial sub-surface mesh structure 700 enables nFETS (n-type MOSFETS) 380 (FIGS. 3A and 3B) to be body-biased in any manner by preventing isolation of a P-type region or P-well region 385 (FIGS. 3A and 3B) on which nFETS 380 are formed. Gap area 730 between axial deep N-well regions 710A-710E and 712A-712D prevents isolation of P-well region 385 and enables a conductive path between P-well region 385 and a sub-surface layer that is beneath axial deep N-well regions 710A-710E and 712A-712D. In an embodiment, the area of axial sub-surface mesh structure 700 is equally divided between axial deep N-well regions (e.g., 710A-710E and 712A-712D) and gap area 730.

As discussed above, a contact for the body-bias voltage Vnw can be formed wherever there is free space, such as above N-well regions or above axial deep N-well regions 710A-710E and 712A-712D. Moreover, the location and size of axial sub-surface mesh structure 700 is based on the distribution of N-wells and P-type regions or P-wells, wherein the goal is to provide low resistance conductive paths for the body-bias voltage Vnw.

As described above, the size of axial sub-surface mesh structure 700 should avoid isolating P-type regions or P-wells 385 (FIGS. 3A and 3B) from sub-surface layers that are formed beneath axial deep N-well regions 710A-710E and 712A-712D. Moreover, gap area 730 is sized so as to provide a low-resistance conductive path between P-type regions or P-wells 385 and a sub-surface layer that is formed beneath axial deep N-well regions, wherein the greater the gap area 730 the lower the resistance of this conductive path. Additionally, lateral diffusion and lateral depletion can further reduce gap area 730, potentially pinching-off this conductive path between P-type regions or P-wells 385 and a sub-surface layer that is formed beneath axial deep N-well regions. As a solution to this situation, gaps 740A and 740B between adjacent axial deep N-well regions are made sufficiently wide to avoid pinching-off this conductive path between P-type regions or P-wells 385 and a sub-surface layer that is formed beneath axial deep N-well regions. Yet, as the number and size of the axial deep N-well regions are increased, the resistance of the conductive path for routing the body-bias voltage Vnw is decreased because there are larger and more sub-surface conductive boundaries between N-well regions and axial deep N-well regions. Hence, there is a trade-off between gap area 730 and axial deep N-well regions in each design situation.

Figure 8A:
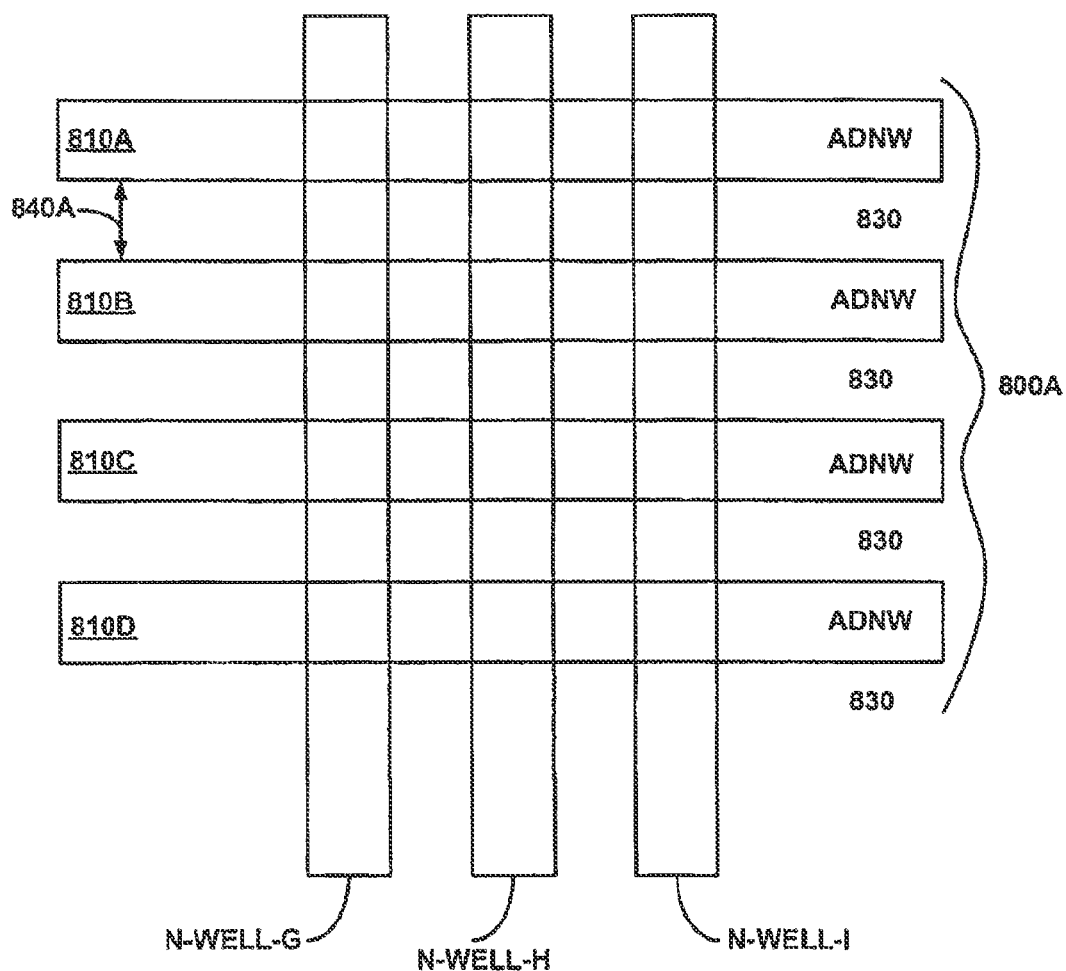
FIG. 8A illustrates a top view of multiple axial deep N-well (ADNW) regions forming a first axial sub-surface strip structure in accordance with an embodiment of the present invention.

FIG. 8A illustrates a top view of multiple axial deep N-well (ADNW) regions forming a first axial sub-surface strip structure 800A in accordance with an embodiment of the present invention. In this layout pattern, each axial deep N-well region 810A-810D has a strip shape, is formed beneath the surface N-well layer of a semiconductor device, and is doped with an N-type material. Axial deep N-well regions 810A-810D are formed in a first parallel orientation. The first parallel orientation is parallel to surface N-well regions (e.g., N-well_G, N-well_H, and N-well_I). In this case, the combination of surface N-well regions (e.g., N-well_G, N-well_H, and N-well_I) and first axial sub-surface strip structure 800A forms a mesh-type arrangement for routing the body-bias voltage to surface N-well regions so that pFETs can be body-biased.

As described above with respect to FIGS. 2A and 2B, the layer corresponding to the deep N-well region is below the layer corresponding to the surface N-well regions. Hence, sub-surface conductive boundaries can be formed between N-well regions and first axial sub-surface strip structure 800A to provide a plurality of sub-surface conductive paths between N-well regions without isolating P-well region located between N-wells. That is, first axial sub-surface strip structure 800A contacts N-wells along the sub-surface conductive boundaries (e.g., sub-surface conductive boundary 25 (FIG. 2A) and sub-surface conductive boundaries 396 and 397 (FIG. 2B)).

As described above, the combination of surface N-well regions (e.g., N-well_G, N-well_H, and N-well_I), and axial deep N-well regions 810A-810D, which form first axial sub-surface strip structure 800A, facilitate routing of the body-bias voltage Vnw to N-well regions so that pFETs can be body-biased. First axial sub-surface strip structure 800A can be utilized in areas of the semiconductor device that have a dense layout and are oriented according to N-well regions of FIG. 3B. It should be understood that first axial sub-surface strip structure 800A can have other configurations. Gap 840A between adjacent axial deep N-well regions can vary in size. Moreover, the ratio of axial deep N-well regions to gap area 830 can vary.

Figure 8B:
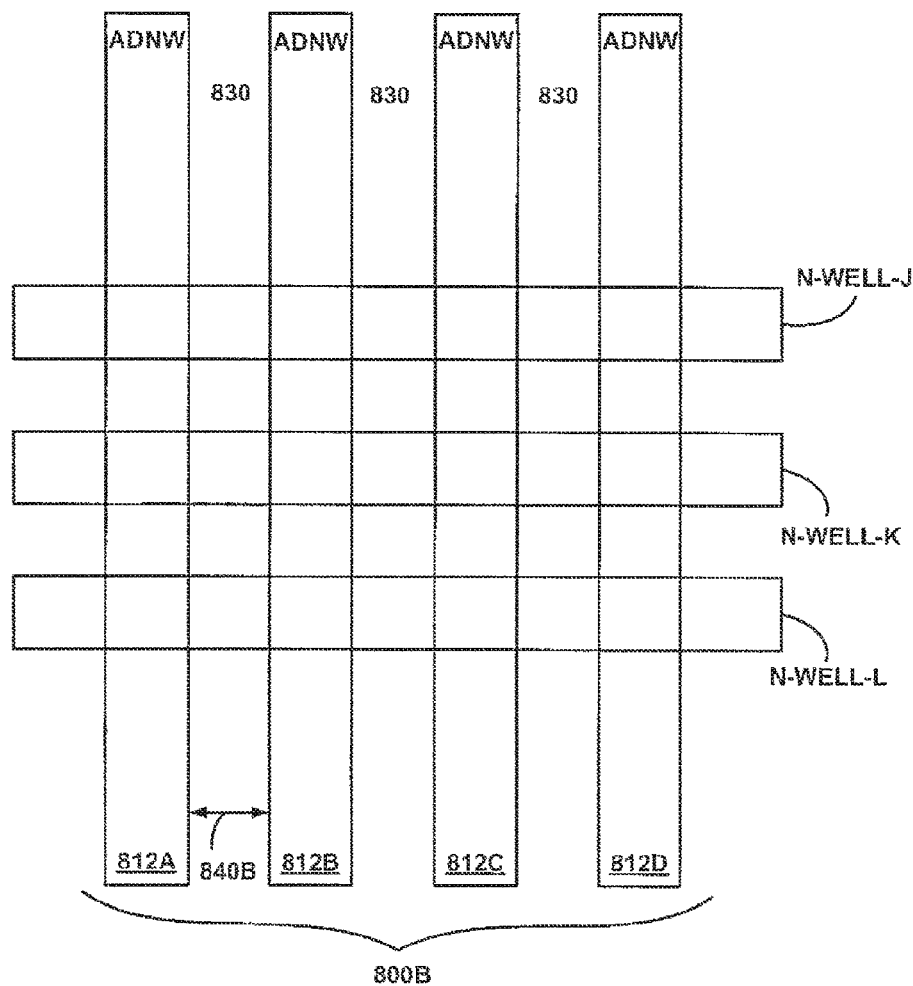
FIG. 8B illustrates a top view of multiple axial deep N-well (ADNW) regions forming a second axial sub-surface strip structure in accordance with an embodiment of the present invention.

FIG. 8B illustrates a top view of multiple axial deep N-well (ADNW) regions forming a second axial sub-surface strip structure 800B in accordance with an embodiment of the present invention. In this layout pattern, each axial deep N-well region 812A-812D has a strip shape, is formed beneath the surface N-well layer of a semiconductor device, and is doped with an N-type material. Axial deep N-well regions 812A-812D are formed in a second parallel orientation. The second parallel orientation is parallel to surface N-well regions (e.g., N-well_J, N-well_K, and N-well_L). In this case, the combination of surface N-well regions (e.g., N-well_J, N-well_K, and N-well_L) and second axial sub-surface strip structure 800B forms a mesh-type arrangement for routing the body-bias voltage to surface N-well regions so that pFETs can be body-biased.

As described above with respect to FIGS. 2A and 2B, the layer corresponding to the deep N-well region is below the layer corresponding to the surface N-well regions. Hence, sub-surface conductive boundaries can be formed between N-well regions and second axial sub-surface strip structure 800B to provide a plurality of sub-surface conductive paths between N-well regions without isolating P-well region located between N-wells. That is, second axial sub-surface strip structure 800B contacts N-wells along the sub-surface conductive boundaries (e.g., sub-surface conductive boundary 25 (FIG. 2A) and sub-surface conductive boundaries 396 and 397 (FIG. 2B)).

As described above, the combination of surface N-well regions (e.g., N-well_J, N-well_K, and N-well_L), and axial deep N-well regions 812A-812D, which form second axial sub-surface strip structure 800A, facilitates routing of the body-bias voltage Vnw to N-well regions so that pFETs can be body-biased. Second axial sub-surface strip structure 800B can be utilized in areas of the semiconductor device that have a dense layout and are oriented according to N-well regions of FIG. 3A. It should be understood that second axial sub-surface strip structure 800B can have other configurations. Gap 840B between adjacent axial deep N-well regions can vary in size. Moreover, the ratio of axial deep N-well regions to gap area 830 can vary.

Structure for Spanning Gap in Deep N-Well Structure for Routing Body-Bias Voltage As noted above, the following description of the present invention is equally applicable to a p-type substrate and an N-well process, as well as to an n-type substrate and a P-well process.

As described above, the deep N-well region can have many different layout patterns for routing the body-bias voltage. Examples of these layout patterns include a diagonal sub-surface mesh structure (FIGS. 5A and 5B), an axial sub-surface mesh structure (FIG. 7), a diagonal sub-surface strip structure (FIGS. 6A and 6B), and an axial sub-surface strip structure (FIGS. 8A and 8B).

When a deep N-well structure is utilized to route the body-bias voltage, there are occasions when the deep N-well structure may be interrupted or separated in multiple sections by an isolation structure. Ideally, the deep n-well structure should not contact or cross the isolation structure because short circuit conditions can be created. This isolation structure is used for nFETs and/or pFETs that form specialized circuits (e.g., I/O circuits, analog circuits, etc.) requiring voltages that are different than the voltages provided to core region nFETs and pFETs. Typically, the isolation structure has a strip configuration of various lengths. It should be understood that the isolation structure can also be a deep N-well structure having a voltage bias that is different than the voltage bias of another deep N-well structure.

For isolating nFETs, the isolation structure is comprised of a continuous (surface) N-well perimeter and a solid deep N-well plate structure, forming a p-type isolation tub. For isolating pFETs, the isolation structure is comprised of a separate (surface) N-well. Moreover, the isolation structure can be configured for isolating both nFETs and pFETs. In this case, one or more perimeter sides of the continuous (surface) N-well perimeter of the isolation structure can help form the isolated pFETs.

Although the discussion below will focus on deep N-well mesh structures (e.g., diagonal sub-surface mesh structure (FIGS. 5A and 5B)), the discussion is equally applicable to other deep N-well structures utilized to route the body-bias voltage.

Figure 9A:
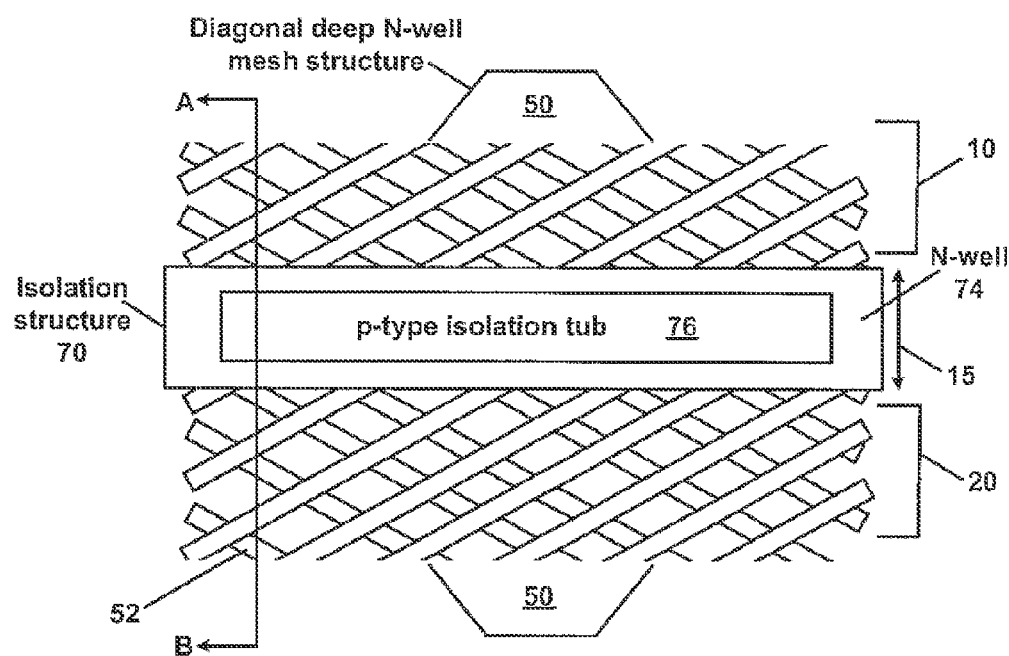
FIG. 9A illustrates a top view of a semiconductor device, showing a first deep N-well mesh structure, a second deep N-well mesh structure, and an isolation structure formed between these deep N-well mesh structures to create a gap between these deep N-well mesh structures in accordance with an embodiment of the present invention.

FIG. 9A illustrates a top view of a semiconductor device 100, showing a first deep N-well mesh structure 10, a second deep N-well mesh structure 20, and an isolation structure 70 formed between deep N-well mesh structures 10 and 20 to create a gap between deep N-well mesh structures 10 and 20 in accordance with an embodiment of the present invention. As depicted in FIG. 9A, isolation structure 70 created a gap 15 in a deep N-well mesh structure 50, wherein gap 15 separated deep N-well mesh structure 50 into first deep N-well mesh structure 10 and second deep N-well mesh structure 20. Here, deep N-well mesh structure 50 is a diagonal deep N-well mesh structure. Deep N-well mesh structure 50 is comprised of a plurality of diagonal deep N-well regions 52.

Figure 9B:
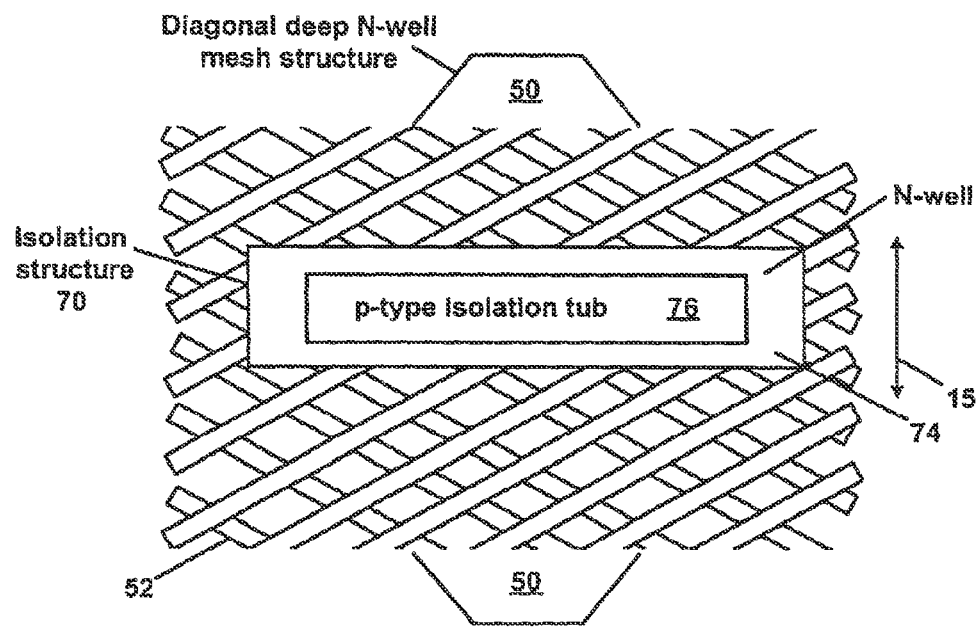
FIG. 9B illustrates a top view of a semiconductor device, showing a deep N-well mesh structure and an isolation structure that creates a gap in the deep N-well mesh structure in accordance with an embodiment of the present invention.

FIG. 9B illustrates a top view of a semiconductor device 100, showing a deep N-well mesh structure 50 and an isolation structure 70 that creates a gap 15 in deep N-well mesh structure 50 in accordance with an embodiment of the present invention As depicted in FIG. 9B, isolation structure 70 created a gap 15 in a deep N-well mesh structure 50, wherein gap 15 interrupts deep N-well mesh structure 50 rather than separating it. Isolation structure 70 is formed within the perimeter of deep N-well mesh structure 50. Here, deep N-well mesh structure 50 is a diagonal deep N-well mesh structure. Deep N-well mesh structure 50 is comprised of a plurality of diagonal deep N-well regions 52.

Referring to FIGS. 9A and 9B, isolation structure 70 includes an N-well perimeter 74 and a solid deep N-well plate structure 25 (see FIG. 10), forming a p-type isolation tub 76. Isolation structure 70 is utilized to form specialized circuits (e.g., I/O circuits, analog circuits, etc.), as described above.

Gap 15 interrupts the routing of body-bias voltage. However, if the area of gap 15 is sufficiently large to negatively affect the electrical resistance property of deep N-well mesh structure 50, corrective action has to be taken to reduce the impact of gap 15 (due to isolation structure 70) on the electrical resistance property of deep N-well mesh structure 50. As will be described below, at least one metal structure 80 (see FIGS. 11A and 11B) is formed across the isolation structure 70 to address the impact of gap 15 (due to the isolation structure 70) on the electrical resistance property of the deep N-well mesh structure 50. Metal structure 80 (see FIGS. 11A and 11B) is coupled to deep N-well mesh structure 50 with tap contacts on opposite sides of isolation structure 70.

FIG. 10 illustrates a cross-sectional view of semiconductor device 100 of FIG. 9A along line A-B in accordance with an embodiment of the present invention. Deep N-well mesh structure 50 (see FIG. 9A) is formed below surface 90. As shown in FIG. 10, isolation structure 70 includes an N-well perimeter 74 and a solid deep N-well plate structure 25, forming a p-type isolation tub 76. Gap 15 separates deep N-well mesh structure 50 (see FIG. 9A) into first deep N-well mesh structure 10 and second deep N-well mesh structure 20. First deep N-well mesh structure 10 does not contact isolation structure 70. Additionally, second deep N-well mesh structure 20 does not contact isolation structure 70. The first and second deep N-well mesh structures 10 and 20 are comprised of a plurality of diagonal deep N-well regions 52.

It should be understood that regions 94 and 96 are utilized to form nFETs and pFETs described in FIGS. 1-8B.

Figure 11A:
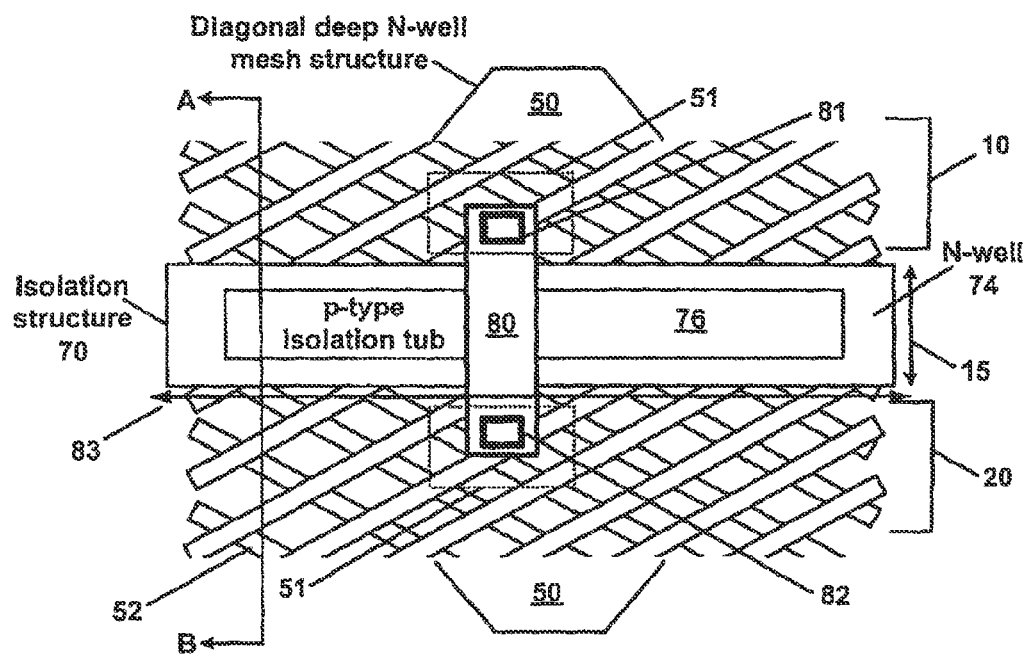
FIG. 11A illustrates a top view of semiconductor device of FIG. 9A, showing a metal structure for spanning the isolation structure in accordance with an embodiment of the present invention.

FIG. 11A illustrates a top view of semiconductor device 100 of FIG. 9A, showing a metal structure 80 for spanning isolation structure 70 in accordance with an embodiment of the present invention. Similarly, FIG. 11B illustrates a top view of semiconductor device 100 of FIG. 9B, showing a metal structure 80 for spanning isolation structure 70 in accordance with an embodiment of the present invention.

Figure 11B:
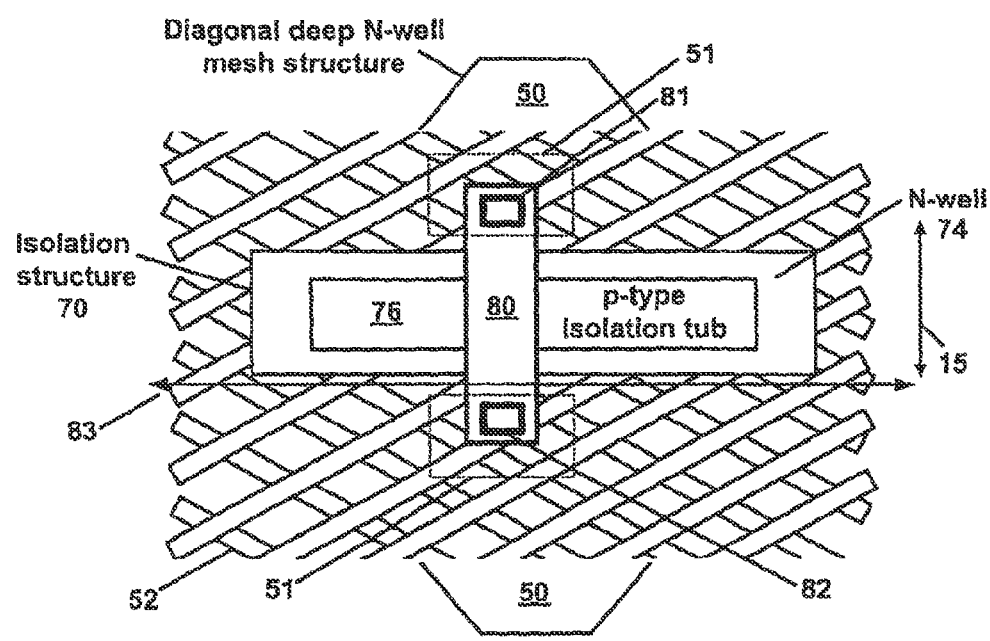
FIG. 11B illustrates a top view of semiconductor device of FIG. 9B, showing a metal structure for spanning the isolation structure in accordance with an embodiment of the present invention.

Referring to FIGS. 11A and 11B, at least one metal structure 80 is utilized to span isolation structure 70. Metal structure 80 carries electrical current across isolation structure 70. While in FIG. 11A tap contact 81 couples metal structure 80 to first deep N-well mesh structure 10, tap contact 81 couples metal structure 80 to deep N-well mesh structure 50 in FIG. 11B. Moreover, while in FIG. 11A tap contact 82 couples metal structure 80 to second deep N-well mesh structure 20, tap contact 82 couples metal structure 80 to deep N-well mesh structure 50 in FIG. 11B. In an embodiment, metal structure 80 has a metal wire shape. It should be understood that metal structure 80 can have other shapes. For example, the portion of metal structure 80 that overlaps deep N-well mesh structure 10 (FIG. 11A), 20 (FIG. 11A), and 50 (FIG. 11B) can have a T-shape. This enables the formation of additional tap contacts from metal structure 80 to deep N-well structure 10 (FIG. 11A), 20 (FIG. 11A), and 50 (FIG. 11B). This provides lower resistance between metal structure 80 and deep N-well structure 10 (FIG. 11A), 20 (FIG. 11A), and 50 (FIG. 11B).

Metal structure 80 can be comprised of a single metal layer. Alternatively, metal structure 80 can be comprised of a plurality of metal layers. Furthermore, the number of metal structures 80 needed is dependent on several factors. These factors include the sheet resistance of deep N-well mesh structure, the sheet resistance of metal structure 80, and the width 83 of isolation structure 70.

In an embodiment, a deep N-well plate 51 (FIG. 11A and FIG. 11B) can be formed beneath metal structure 80 where tap contacts 81 and 82 are located. The deep N-well plate 51 is a continuous sub-surface layer rather than a sub-surface patterned layer as described in FIGS. 1-11B with respect to deep N-well structures for routing body-bias voltage. Each deep N-well plate 51 is coupled to deep N-well structure 10 (FIG. 11A), 20 (FIG. 11A), and 50 (FIG. 11B). Thus, lower resistance between metal structure 80 and deep N-well structure 10 (FIG. 11A), 20 (FIG. 11A), and 50 (FIG. 11B) is achieved. In an embodiment, deep N-well plates 51 are diagonally oriented (or rotated with respect to the position shown in FIGS. 11A and 11B) to provide greater intersection between deep N-well structure and deep N-well plate 51.

The values provided henceforth to determine the benefits of using metal structure 80 are illustrative. The present invention is not limited to these values. The values may be different in other cases for numerous reasons (e.g., manufacturing process utilized, materials utilized, etc.). The sheet resistance of deep N-well region is approximately 1000 ohms per square. The sheet resistance of deep N-well mesh structure 50 is approximately 2000 ohms per square. The sheet resistance of a metal sheet is approximately 0.2 ohms per square. The goal is to supply sufficient metal structure(s) to improve the resistance property of deep N-well mesh structure 50 having gap 15.

In an embodiment, the width of metal structure 80 is approximately 1 μm (or 1 unit) wide, wherein μm represents micrometers. Moreover, a metal structure 80 is placed approximately every 1000 μm or (1000 units), wherein μm represents micrometers. Thus, the sheet resistance of metal structure 80 is approximately 200 ohms per square (0.2.times.1000), since metal structure 80 (of approximately 1 μm width) is placed approximately every 1000 μm. Since the sheet resistance of a metal sheet is approximately 1000 times lower (or better) than the sheet resistance of deep N-well mesh structure 50, metal structure(s) 80 have no more electrical resistance than the electrical resistance of the portion of deep N-well mesh structure 50 that could occupy the area of gap 15.

Moreover, since metal structure 80 is placed every 1000 μm, the capacitance of metal structure(s) 80 does not appreciably increase the capacitance of deep N-well mesh structure 50. Thus, metal wire to metal wire coupled noise on metal structure 80 does not significantly contribute to body-bias voltage noise (or substrate noise).

Alternatively, metal structure 80 can be replaced with structures comprised of polysilicon wiring, diffusion wiring, or silicide wiring. However, these alternative implementations are less beneficial than using metal structure 80. Higher sheet resistance and a larger number of these structures formed across the isolation structure characterize these alternative implementations.

The above discussion focused on deep N-well mesh structures (e.g., diagonal sub-surface mesh structure of FIGS. 5A and 5B). However, the above discussion is equally applicable to other deep N-well structures utilized to route the body-bias voltage.

The foregoing descriptions of specific embodiments of the present invention have been presented for purposes of illustration and description. They are not intended to be exhaustive or to limit the invention to the precise forms disclosed, and many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A semiconductor device comprising:
    at least two conductive regions of a first conductivity formed beneath a surface of the semiconductor device, wherein the at least two conductive regions are configured to route a body-bias voltage, and wherein the at least two conductive regions do not contact one another; and
    at least one metal structure formed above the surface, wherein the at least one metal structure is coupled to the at least two conductive regions.

2. The semiconductor device of claim 1, wherein each conductive region has an N-type doping.

3. The semiconductor device of claim 1, wherein each conductive region has a P-type doping.

4. The semiconductor device of claim 1, wherein each conductive region has a strip shape.

5. The semiconductor device of claim 1, wherein the metal structure has a metal wire shape.

6. The semiconductor device of claim 1, wherein the at least two conductive regions do not reach the surface.

7. A semiconductor device having a surface, the semiconductor device comprising:
    at least two conductive regions of a first conductivity, wherein each conductive region is formed beneath the surface, and wherein the at least two conductive regions form a first sub-surface structure operable to route a body-bias voltage;

at least two other conductive regions of the first conductivity, wherein each other conductive region is formed beneath the surface, wherein the other conductive regions form a second sub-surface structure operable to route the body-bias voltage and wherein the first and second sub-surface structures are physically separate; and at least one metal structure formed above the surface, wherein the at least one metal structure couples the first sub-surface structure and the second sub-surface structure via at least two tap contacts.

8. The semiconductor device of claim 7, wherein each conductive region has an N-type doping.

9. The semiconductor device of claim 7, wherein each conductive region has a P-type doping.

10. The semiconductor device of claim 7, wherein at least one of the conductive regions has a strip shape.

11. The semiconductor device of claim 7, wherein the metal structure has a metal wire shape.

12. The semiconductor device of claim 7, wherein the conductive structures do not reach the surface.

13. A semiconductor device having a surface, the semiconductor device comprising:

at least two conductive regions of a first conductivity formed beneath a surface of the semiconductor device, wherein the at least two conductive regions are configured to route a body-bias voltage, and wherein the at least two conductive regions are non-continuous; and at least one conductive structure above the surface that is coupled to the at least two conductive regions.

14. The semiconductor device of claim 13, wherein each conductive region has an N-type doping.

15. The semiconductor device of claim 13, wherein each conductive region has a P-type doping.

16. The semiconductor device of claim 13, wherein each conductive region has a strip shape.

17. The semiconductor device of claim 13, wherein the conductive structure is a polysilicon wire.

18. The semiconductor device of claim 13, wherein the conductive structure is a diffusion wire.

19. The semiconductor device of claim 13, wherein the conductive structure is a silicide wire.

20. The semiconductor device of claim 13, wherein each of the conductive regions has a continuous sub-surface layer shape.

\* \* \* \* \*